United States Patent

Yamada et al.

Patent Number: 5,965,064
Date of Patent: Oct. 12, 1999

[54] ANISOTROPICALLY ELECTROCONDUCTIVE ADHESIVE AND ADHESIVE FILM

[75] Inventors: Yukio Yamada, Kanuma; Masao Saito, Tanuma-Machi; Junji Shinozaki, Utsunomiya; Motohide Takeichi, Yono, all of Japan

[73] Assignee: Sony Chemicals Corporation, Tokyo, Japan

[21] Appl. No.: 09/176,167

[22] Filed: Oct. 21, 1998

[30] Foreign Application Priority Data

Oct. 28, 1997 [JP] Japan ................................. 9-296005

[51] Int. Cl.$^6$ .............................. H01B 1/02; H01B 1/22; B32B 5/00
[52] U.S. Cl. .......................... 252/512; 252/514; 252/513; 252/519.3; 428/407; 428/220; 428/283; 174/259
[58] Field of Search ..................... 252/512, 514, 252/519.3; 428/403, 407, 212, 220, 283, 303; 174/259, 261

[56] References Cited

U.S. PATENT DOCUMENTS 5,120,665  6/1992  Tsukagoshi et al. ...................... 437/8
5,225,966  7/1993  Basavanhally et al. ................. 361/406

*Primary Examiner*—Mark Kopec
*Assistant Examiner*—Derrick G. Hamlin
*Attorney, Agent, or Firm*—Flynn, Thiel, Boutell & Tanis P.C.

[57] ABSTRACT

An anisotropically electroconductive adhesive to be used for establishing electric connection between terminals of, for example, an IC chip and of a circuit pattern, at a low cost with high reliabilities both in the establishment of electric connection and in the insulation upon the connection without suffering from short-circuiting between circuit lines in the circuit and without causing any obstruction on the circuit, even when the terminals or the circuit lines are disposed at close intervals, which adhesive comprises an electrically insulating adhesive matrix and electroconductive particles dispersed in the matrix, wherein the electroconductive particles comprise at least two electroconductive particulate products of different average particle sizes and wherein each particle of both the particulate products is coated with an electrically insulating resin insoluble in the insulating adhesive matrix.

13 Claims, 4 Drawing Sheets

5,965,064

ANISOTROPICALLY ELECTROCONDUCTIVE ADHESIVE AND ADHESIVE FILM

FIELD OF THE INVENTION

The present invention relates to an anisotropically electroconductive adhesive for electrically connecting and mechanically binding electric lines or circuits confronting to each other and to an anisotropically electroconductive adhesive film made from such adhesive. More specifically, the present invention relates to an anisotropically electroconductive adhesive to be used favorably for, especially, so-called "flip-chip bonding" for connecting directly an IC chip with a circuit as well as to an anisotropically electroconductive adhesive film made from such adhesive.

BACKGROUND OF THE INVENTION

Under the recent trend in the art to making electronic elements and parts in a thin geometry and in light weighing, so-called "bear-chip mounting" and "flip-chip bonding" for directly mounting IC chips on electronic elements and parts have found applications to the assemblage of such electronic elements and parts.

For direct assemblage of IC chips on substrate of circuit pattern, there have hitherto been practised, for example, 1) the "wire-bonding" technique in which the terminal electrodes of the IC chip are connected using gold microwires with corresponding terminals in the circuit pattern formed on the substrate, 2) the "face-down" technique in which the terminal electrodes of the IC chip and the corresponding terminals in the circuit pattern formed on the substrate are connected by means of "reflowing" of solder and 3) the anisotropic connection technique in which the terminal electrodes in a form of microbumps on the IC chip and the corresponding terminals in the circuit pattern formed on the substrate are connected by press-fixation of the IC chip and the circuit pattern-carrying substrate together under interposition of a layer of an anisotropically electroconductive adhesive therebetween. Among them, the anisotropic connection technique using an electroconductive adhesive (including an anisotropically electroconductive adhesive film prepared by forming a layer of an anisotropically electroconductive adhesive on an exfoliative film, namely, a film easily peeled off therefrom, with subsequent heating and drying of the layer) has recently attained wide uses, since it provides many profits, such as convenience in the practical operation, high reliability of establishment of electric connection and unnecessity of sealing of the assembly with simultaneous permission of a high density assembly at a minimum cost.

In accompaniment with the decrease in the size of the IC bumps (projecting terminal electrodes) and with the trend to designing the circuit pattern in a finer pitch, however, it becomes necessary to use electroconductive particles of smaller particle size in the anisotropically electroconductive adhesive and, in addition, there is a common trend to the use of higher content of the electroconductive particles in the adhesive for increasing the reliability of establishment of an assured electric connection.

Under these circumstances, there occurred problems in that fluctuation of condition for building up the electric connection by the adhesive is brought about due to the secondary agglomeration of the conductor particles and short-circuiting between electric lines in the circuit pattern on the substrate may occur, when electroconductive particles of smaller particle size is employed, and in that short-circuiting between electric lines in the circuit pattern on the substrate may also happen, when the content of the electroconductive particles is increased.

As countermeasures therefor, attempts have been proposed, such as those in which insulator-coated conductor particles having each particle coated with a layer of insulator is used and in which a plurality of anisotropically electroconductive films are used under lamination in order to prevent dislodging or exilation of the conductor particles away from the region of the terminal electrode during the course of building up of the electric connection by the press-fixation.

Use of such insulator-coated conductor particles may give birth to some fear of reduction in the long term reliability for assured electric connection due to the hardness and elasticity thereof. When the blending proportion of the insulator-coated conductor particles, which are constituted, in general, mainly of a particulate product having an average particle size of about 5 µm, is increased to a value of, for example, 40,000 particles/mm²-film, a reliable insulation or exclusion of occurrence of short-circuiting may difficultly be maintained for binding an IC chip of a bump pitch of 10 µm or less.

While, on the other hand, use of multilayered anisotropically electroconductive film may permit increase in the blending proportion of the conductor particles up to, for example, about 80,000 particles/mm²-film for smaller size conductor particles having an average particle size of about 3 µm, it is necessary in this case to form bumps in a higher accuracy with simultaneous requirement of rigorous administration of precision of the pressing condition upon establishment of the electric connection, resulting in a high production cost.

In Japanese Patent Application Kokai Hei 4-174980 A, an electrically connecting composition for connecting lines of electric circuit is disclosed, which comprises, on the one hand, an insulator-coated particulate product in which each particle of an electric conductor deformable upon being heated is coated with a layer of a thermoplastic insulator and, on the other hand, a particulate thickness-regulating product having a hardness higher than that of the insulator-coated particulate product, wherein both particualte products are dispersed in a matrix of an adhesive material of insulating nature capable of exhibiting a plastic flow when heated.

This electrically connecting composition is, however, difficult to acquire a high reliability for establishing an electric connection when the thickness-regulating product is made of an electric insulator, since this product does not participate in the establishment of an electric connection. When the thickness-regulating product is made of an electric conductor, a higher blending proportion thereof may permit occurrence of short-circuiting, obstructing thus the reliability of insulation or exclusion of occurrence of short-circuiting. Moreover, when the thickness-regulating product consists of particles having uneven particle sizes, the thickness of the resulting assembly is determined by the largermost particle in this product, as the thickness-regulating particles have high hardness, so that particles having sizes smaller than the largermost one cannot participate in the establishment of an electric connection, resulting also in a defective reliability in the establishment of electric connection.

In Japanese Patent Application Kokai Hei 9-102661 A, a method for providing electric connection between terminal electrodes using an electroconductive microparticulate product having a certain compressive hardness (K-value) and a specific restorability from deformation.

Use of such an electroconductive micro-particulate product as above may, however, difficultly result in attainment of high reliabilities both in the establishment of electric connection and in the insulation upon connection of an IC chip of a fine pitch circuit pattern.

SUMMARY OF THE INVENTION

An object of the present invention is to provide an anisotropically electroconductive adhesive to be used for establishing electric connection between terminals of, for example, an IC chip and of a circuit pattern, at a low cost with high reliabilities both in the establishment of electric connection and in the insulation upon the connection without short-circuiting between circuit lines in the circuit and without causing any obstruction on the circuit, even when the terminals or the circuit lines are disposed at close intervals.

Another object of the present invention is to provide an anisotropically electroconductive adhesive film made from such adhesive to be used for establishing electric connection between terminals of, for example, an IC chip and of a circuit pattern, at a low cost with high reliabilities both in the establishment of electric connection and in the insulation upon the connection without short-circuiting between circuit lines in the circuit and without causing any obstruction on the circuit, even when the terminals or the circuit lines are disposed at close intervals.

The anisotropically electroconductive adhesive according to the present invention comprises an electrically insulating adhesive matrix and electroconductive particles dispersed in the matrix, wherein the electroconductive particles comprise at least two electroconductive particulate products of different average particle sizes and wherein each particle of both the particulate products is coated with an electrically insulating resin insoluble in the insulating adhesive matrix.

The anisotropically electroconductive adhesive film according to the present invention comprises an anisotropically electroconductive adhesive, the said adhesive comprising an electrically insulating adhesive matrix and electroconductive particles dispersed in the matrix, wherein the electroconductive particles comprise at least two electroconductive particulate products of different average particle sizes and wherein each particle of both the particulate products is coated with an electrically insulating resin insoluble in the insulating adhesive matrix.

DETAILED DESCRIPTION OF THE INVENTION

Figure 1:
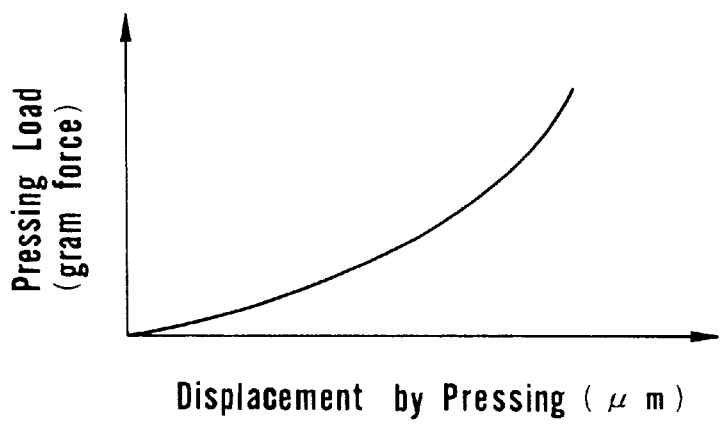
FIG. 1 shows the relationship between the displacement by pressing and the pressing load on the conductor particles in a graph.

For the electrically insulating adhesive matrix according to the present invention, there may be employed various thermosetting and thermoplastic resins and rubbers. Thermosetting resins are preferred in the point of view of the reliability of the resulting electric connection. As the thermosetting resins, there may be enumerated, for example, synthetic resins, such as, epoxy resins, melamine resins, phenol resins, diallyl phthalate resin, bismaleimidotriazine resin, polyesters, polyurethanes, phenoxy resins, polyamides and polyimides; and rubbers and elastomers containing functional group(s), such as hydroxy, carboxyl, vinyl, amino or epoxy. Among them, epoxy resins are especially preferred for their characteristic features.

As the epoxy resin, there may be used, for example, those of bisphenol type, epoxynovolak resins and those made from epoxy compounds having in the molecule two or more oxirane groups.

These epoxy resins to be used according to the present invention may preferably be of high grade product having a content of impurity ions, above all chloride ion, in an amount not higher than 50 ppm.

The particulate conductor to be incorporated in the anisotropically electroconductive adhesive according to the present invention may preferably comprise electroconductive particles each coated with a layer of an electrically insulating material insoluble in the above-mentioned electrically insulating adhesive matrix, wherein each core particle is made of a metal or made of a polymer material having an electroconductive surface coating layer of a metal.

As the metal particles, there may be exemplified particles of nickel or a solder alloy.

As the polymer material for the core particle, there may be exemplified synthetic resins, such as epoxy resins, styrene resins, silicone resins, acryl resins, acryl/styrene resins (copolymers of acrylate with styrene) polyolefines, melamine resine and benzoguanamine resin; synthetic rubbers, such as cross-linked divinylbenzene polymer and NBR and SBR; and mixtures of them. Among them, preference is given to styrene resins, acryl resins, acryl/styrene resins, benzoguanamine resin and the cross-linked divinylbenzene polymer. There is no special limitation as to the material properties, such as hardness and elasticity, for these polymer material and one can select therefor any material exhibiting voluntarily desired properties.

For the electroconductive material for the electroconductive surface coating layer on the core particle, at least one metal, such as nickel, gold and copper can be used. The electroconductive material may preferably be present as a coating layer formed over the entire surface of the core particle of a polymer material by a galvanic or currentless plating. The thickness of the electroconductive surface coating layer may favorably be in the range of 5–300 nm, preferably in the range of 10–200 nm. Special preference is given to a particulate electroconductive material composed of particles each comprising a core particle of a polymer material and, coated thereon, a double-layered coating layer formed by first plating on the polymer material core particle with nickel as the base coating and then with gold thereon, wherein the thickness of the base coating of nickel may favorably be in the range of 10–300 nm, preferably 30–200 nm, and the thickness of the gold layer may favorably be in the range of 5–100 nm, preferably 10–30 nm.

As the electrically insulating resin for coating the electroconductive particles, namely, metal particles or metal-coated polymer particles, to form the electroconductive particles according to the present invention, any resin can be used without limitation, so long as it is insoluble in the electrically insulating adhesive matrix and does not obstruct development of electric conductivity developed when the anisotropically electroconductive adhesive containing the so-coated conductor particles is heat-pressed and the coated particles contained therein are crushed or collapsed to thereby build up an electroconductive path through the mass of the adhesive by the crushed particles held under metallic contact with each other. Preferably, an acryl resin, a styrene resin or an acryl/styrene resin may be used for such a coating resin.

It is favorable that the insulating coating resin is present in a form of a layer covering the entire surface of the electroconductive particle and the coating may favorably composed, in particular, of a cross-linked layer of acryl resin, a styrene resin or an acryl/styrene resin.

The thickness of the cross-linked insulating resin layer may favorably be in the range of 0.05 to 2 μm, preferably of 0.1 to 0.5 μm.

The at least two electroconductive particulate products having different average particle sizes to be incorporated in the anisotropically electroconductive adhesive according to the present invention should preferably not cause any thermal deformation at the temperature of assemblage using the anisotropically electroconductive adhesive or the anisotropically electroconductive adhesive film according to the present invention, such as for example, at 200° C., but cause a deformation, especially an elastic deformation, under the pressure at the press-fixation, such as for example, 400 kgf/cm²-bump. Concretely, the electroconductive particulate products may preferably comprise particles of which core particle is made of elastic resins, for example, styrene resins, acryl resins, acryl/styrene copolymer resins and benzoguanamine resin.

According to the present invention, two or more electroconductive particulate products having different average particle sizes are used for the electroconductive particles. The average particle size of the over-all electroconductive particles may favorably be in the range of 1–10 μm, preferably 2–7 μm. In the case of using them for binding a microbump having a bump surface area of 4,000 μm² or less or exhibiting a bump interval of 10 μm or less formed on an IC chip with corresponding terminal in a circuit pattern formed on a substrate, the over-all average particle size may favorably be in the range of 2–7 μm, preferably 3–6 μm. If the over-all average particle size is less than 1 μm, the particles may not only tend to cause occurrence of secondary agglomeration, but also suffer from difficulty in the handling upon the production thereof. If, on the other hand, the over-all average particle size exceeds over 10 μm, the exclusion of occurrecne of short-circuiting between the circuit lines for circuit pattern having close line intervals becomes decreased.

THE BEST MODE FOR EMBODYING THE INVENTION

Below, the present invention will be described in more detail by way of an embodiment in which two electroconductive particulate products are employed for the conductor particles. The difference in the average particle size between the two particulate conductor products should favorably be 0.5–5 μm, preferably 1–3 μm. For the case where the anisotropically electroconductive adhesive is used for binding microbumps having a surface area of not greater than 4,000 μm² or having inter-bump distances of not greater than 10 μm to be used as terminal electrodes disposed on an IC chip with corresponding terminals of a microcircuit formed as a circuit pattern arranged in close line intervals on a substrate, the conductor particles used therein may favorably be a combination of a particulate conductor product having an average particle size in the range of 3±0.5 μm and a particulate conductor product having an average particle size in the range of 5±0.5 μm.

It is preferable that the particulate conductor product having smaller average particle size has a hardness which is equal to or greater than that of the product of greater average particle size. Concretely, it is preferable that the K-value of the particulate conductor product having smaller average particle size is higher than that of the product having greater average particle size and, for example, the particulate conductor product having smaller average particle size may have a K-value of at least 350 kgf/mm², preferably at least 500 kgf/mm², and the particulate conductor product having greater average particle size may have a K-value of not higher than 450 kgf/mm² and preferably in the range of 100–450 kgf/mm². It is particularly favorable that the K-value of the particulate conductor product having smaller average particle size is by at least 50 kgf/mm², preferably, by at least 100 kgf/mm², higher than that of the product having greater average particle size. In the case of using two particulate conductor products each having an average particle size of 3±0.5 μm and an average particle size of 5±0.5 μm, respectively, the particulate conductor product having an average particle size of 3±0.5 μm should have a K-value of at least 450 kgf/mm², preferably at least 600 kgf/mm², and the particulate conductor product having an average particle size of 5±0.5 μm should have a K-value of at the most 450 kgf/mm² and preferably in the range of 100–450 kgf/mm², wherein the difference between the K-values for these conductor products should be at least 50 kgf/mm², preferably at least 100 kgf/mm².

Below, the definition of K-value is explained:

According to the "Theory of Elasticity" in Landau-Riffschitz Theoretical Physics Curriculum, issued from Tokyo Tosho on 1972, on page 42, problems of contact between two elastic spherical bodies having each a radius of R and R' are dealt with by the following equations:

$$h = F^{2/3}[D^2\{(1/R)+(1/R')\}]^{1/3} \quad (1)$$

$$D = (3/4)[\{(1-\sigma^2)/E\} + \{(1-\sigma'^2)/E'\}] \quad (2)$$

In the above equations, h denotes the difference between the distance (R+R') and the distance between the centers of the two spheres, F represents the compressive force, E and E' represent each the elasticity of each of the elastic spheres and σ and σ' represent each the Poisson ratio of each of the elastic spheres.

An approach to the case of contact between a spherical body and a plate under pressing the sphere onto the plate surface may be possible by applying the above theoretical treatment by assuming that R'→∞ and E>E', whereby the following approximation equation is obtained:

$$F=(2^{1/2}/3) \cdot (S^{3/2}) \cdot (E \cdot R^{1/2}) \cdot (1-\sigma^2) \quad (3)$$

in which S represents the magnitude of deformation by pressing.

The K-value is defined by the equation $$K=E/(1-\sigma^2) \quad (4)$$

It follows from the equations (3) and (4)

$$K=(3/\sqrt{2}) \cdot F \cdot S^{-3/2} \cdot R^{-1/2} \quad (5)$$

Thus, the K-value represents the hardness of a spherical body in a universal and quantitative expression. Therefore, the hardness of a microparticle can be represented definitely and quantitatively using the K-value.

The K-value of an elastic spherical body can be determined in the following manner:

A particulate substance to be inspected present as spherical particles is scattered over a steel plate and one particle is chosen as the objective sample among those scattered over the surface of the steel plate. The sample particle is pressed onto the surface of the steel plate by a flat end face of a thin diamond rod having a diameter of 50 μm on a powder compression tester (for example, Model PCT-200 of Shimadzu Corporation). The pressing load is detected by converting it into an electromagnetic signal and the displacement due -to pressing is detected by converting it into an electric signal using a differential transformer. In this manner a relationship between the pressing load and the displacement by pressing is obtained as shown in FIG. 1 illustratively. From this curve as shown in FIG. 1, the load at 10% pressing strain and the pressing displacement for the sample particle can be determined.

Figure 2:
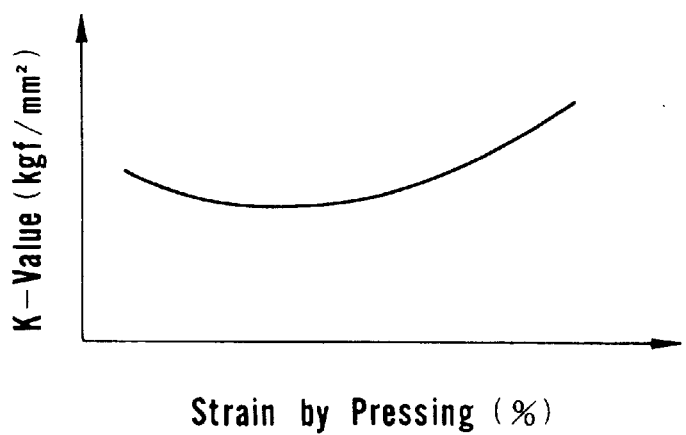
FIG. 2 shows the relationship between the strain by pressing and the K-value for the conductor particles in a graph.

From these observed values in combination with equation (5), the relatioship between the K-value and the pressed strain can be deduced, which is shown in FIG. 2 illustratively. Here, the value for the strain by pressing is a quotient of the pressing displacement by the diameter of the sample particle expressed by percent. The conditions for this determination are:

Pressing rate
  The load is increased in a constant loading rate pressing at a rate of 0.27 gram force (gf) per second.
Testing load: maximum 10 gf
Test temperature: 20° C.

Figure 3:
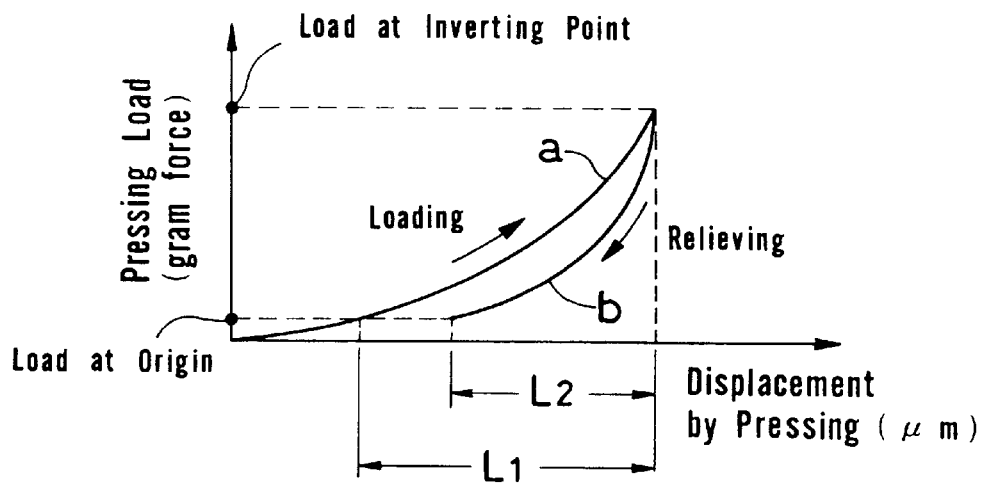
FIG. 3 shows the relationship between the displacement by pressing and the pressing load on the conductor particles during loading and during relieving of load, respectively, in a graph.

It is favorable to use according to the present invention a particulate conductor having a load pressing restorability (Res) of 5–80%, preferably 30–80%, determined by the method as given below:

A particulate substance to be observed present as spherical particles is scattered over a steel plate and one particle is chosen as the objective sample among those scattered on the surface of the steel plate. The sample particle is pressed onto the surface of the steel plate by a flat end face of a thin diamond rod having a diameter of 50 μm on a powder compression tester (for example, Model PCT-200 of Shimadzu Corporation). The pressing load is detected by converting it into an electromagnetic signal and the displacement due to pressing is detected by converting it into an electric signal using a differential transformer. After the particle has been pressed up to an inverting load as shown in FIG. 3 illustratively (along the curve a in FIG. 3), the pressing load is relieved successively (along the curve b in FIG. 3) in order to observe the relationship between the load and the pressing displacement. Here, the load relieving is not terminated at the original zero load but is terminated at 0.1 gf, named as load at origin. The load pressing restorability Res is defined by the percent value of the ratio of displacement $L_1$ starting from the load at origing till the inverting point relative to the displacement $L_2$ starting from the load at origin to the inverting point.

$$Res(\%)=(L_2/L_1)\times 100 \quad (6)$$

The conditions for the determination are:
Load at inverting point: 1.0 gf
Load at origin: 0.1 gf
loading or relieving rate: 0.27 gf/sec.
Test temperature: 20° C.

The content of the conductor particles in the anisotropically electroconductive adhesive according to the present invention may preferably greater for the particulate conductor product having smaller average particle size than for the particulate conductor product having greater average particle size. In a concrete embodiment, the superficial density of the particualte conductor product having smaller average particle size in an anisotropically electroconductive film according to the present invention may favorable be in the range of 30,000–80,000, preferably 30,000–50,000 particles/mm², and that of the particulate conductor product having greater average paricle size may preferably be in the range of 10,000–30,000, preferably 15,000–30,000 particles/mm² of the surface area of the adhesive layer. The proportion of the particulate conductor product having smaller average particle size relative to that having greater average particle size in terms of the ratio in number of particles may favorably be in the range of 1.1 to 8, preferably 1.3 to 4. In the case where particulate conductor products each having an average particle size of 3±0.5 μm and 5±0.5 μm, respectively, are employed, they may preferably be contained in the adhesive film in a concentration in the above-mentioned range.

The superficial density of the particulate conductor product is defined by the number of particles contained in the anisotropically electroconductive adhesive film (before being applied to the bonding face) formed from the anisotropically electroconductive adhesive according to the present invention within a rectangular parallelepipedon defined by a bottom face of a unit surface area, namely, one square millimeter, of the adhesive film and a height corresponding to the film thickness. Here, every particle existing on the side surfaces of the rectangular parallelepipedon and being cut therethrough should be counted as ½ of one particle. The film thickness mentioned above is assumed here as identical with the thickness of the film applied to the face to be bonded. Therefore, a higher content of the conductor particles in the adhesive film may permit thinner film thickness, whereas a lower content of the conductor particles requires thicker film thickness.

When the anisotropically electroconductive adhesive film contains particualte conductor products each having a smaller average particle size and a greater average particle size, respectively, in a content within the range mentioned above, the particulate conductor products will be present on one microbump of the IC chip, after having been applied thereto, as represented by number of particles in terms of "average number of particles minus $3_\sigma$" (a denotes the mean deviation) of, favorably, at least one particle per one microbump for the particulate conductor product having greater average particle size and five particles per one microbump for the particulate conductor product having smaller average particle size. Here, the number of particles of the particulate conductor in the anisotropically electroconductive adhesive film can be determined on a microscopic photograph taken at a magnification factor of 500 using an optical microscope by counting the number of particles found within a 200 $\mu$m square area in the photograph and converting the counted number into that to be found within an area of 1 mm$^2$.

The insulator-coated particulate conductor to be used according to the present invention can be produced, for example, by the method as given below:

First, the surface of the core particle of a polymer material is subjected to a surface modification in a known hybridization system (referred to hereinafter as a hybridization treatment). The hybridization treatment brings about a conjugation of a microparticle with other microparticle {See, for example, the magazine "Funtai to Kogyo" (Powdery Products and Industry), Vol. 27, No. 8, 35–42 (1995)}, wherein a parent particulate material and a child particulate material are subjected to a dynamic high speed motion under suspension in a gas phase to impart thermal energy to the particles by kinetic impingement of the particles, in order to cause fixation of the child particles on a parent particle to build up a coating layer thereon.

Figure 4:
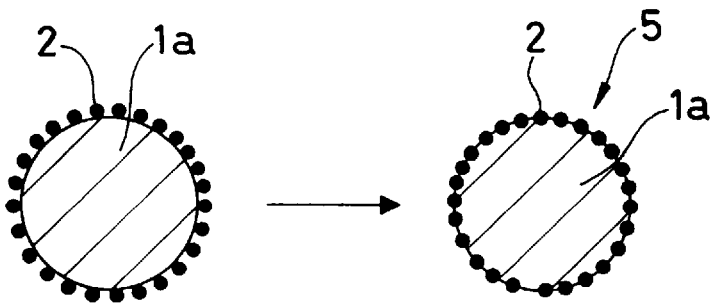
FIGS. 4(a), 4(b), 4(c) and 4(d) illustrate each the state of modification of a core particle made of polymer material by coating thereon with various materials, respectively, in a schematic cross-sectional view.
Figure 4:
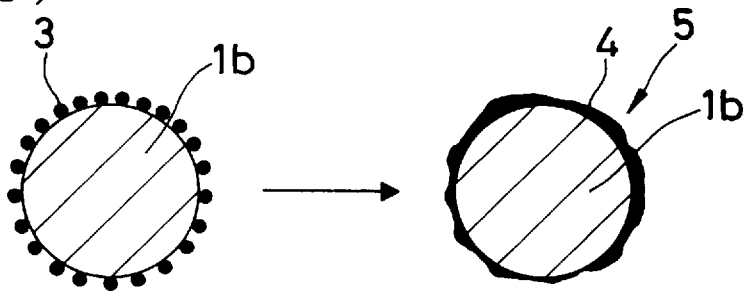
Figure 4:
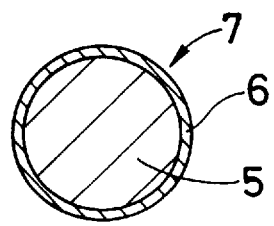
Figure 4:
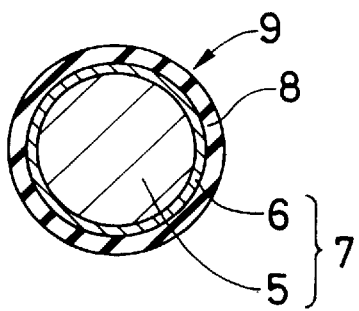

FIG. 4 shows such a hybridization treatment of the core particles with the coating particles in an explanatory schematic illustration. Here, FIG. 4(a) illustrates an example of hybridization treatment of a silicone rubber core particle 1a with nickel particles 2. FIG. 4(b) illustrates another example of hybridization treatment of a benzoguanamine resin core particle 1b with acryl/styrene copolymer particles 3.

When a silicone rubber core particle 1a is subjected to a hybridization treatment with nickel child particles 2, the surface of the parent particle, i.e. the silicone core particle 1a, is modified by the nickel child particles, by being coated with the child particles 2 embedded in the core particle 1a to leave a modified core particle 5 of a polymer material, as shown in FIG. 4(a).

When a benzoguanamine resin core particle 1b is subjected to a hybridization treatment with acryl/styrene copolymer child particles 3, the surface of the benzoguanamine resin parent particle is modified by the acryl/styrene copolymer child particles 3 by being coated with a film of the child particles 3 to leave a modified core particle 5 of a polymer material, as shown in FIG. 4(b).

The resulting hybridization-treated modified core particle 5 is subsequently processed by a metal plating, whereby a particulate electric conductor with each particle 7 being coated with a metal layer 6, as shown in FIG. 4(c) is obtained. The metal plating on the core particles can be realized by a known practice, wherein it is now made possible to effect metal plating of even a silicone rubber particulate product, which has been difficult heretofore to plate with metal by conventional technique, easily by means of a conventional practice, since the surface of the core particle 5 is modified according to the present invention to facilitate metal plating.

A surface coating on the resulting particulate conductor 7 with an electrically insulating resin is performed subsequently to provide each particle 7 with an insulating resin coating layer 8 to obtain a particulate electric conductor having each particle 9 coated with an insulating resin.

For coating the particulate conductor 7 with an electrically insulating reain layer 8, known techniques can be employed, for example, a hybridization treatment described above, an electrostatic coating, spray-coating, solution coating, heat-melt coating and high speed agitation coating. Also for providing the particulate core material with a cross-linked insulating resin layer 9, such as cross-linked acryl resin layer or cross-linked styrene resin layer, the above-mentioned techniques including the hybridization treatment can be employed.

The anisotropically electroconductive adhesive according to the present invention can contain, if necessary, other ingredients than the particulate conductor, such as cross-linking agent and coupling agent based on silane for thermoreactive coating polymer, other film-forming resins and so on.

The anisotropically electroconductive adhesive according to the present invention can be prepared by compounding an electrically insulating polymer material, the particulate conductor products and, if necessary, other ingredients on a suitable mixer to obtain a uniform dispersion.

The anisotropically electroconductive adhesive according to the present invention is used for electrically connecting confronting terminals or wires between electric circuits and at the same time mechanically binding them. It is used, for example, for connecting terminal electrodes of an IC chip with corresponding terminals of a microcircuit formed as a circuit pattern on a substrate, for connecting the terminal electrodes of a liquid crystal panel with corresponding terminals of a circuit formed on a substrate and for other applications. Among them, the application for the connection of IC chip with corresponding terminals in the microcircuit is profitable, wherein a special preference is given to the application for direct binding of IC chip with corresponding terminals of the microcircuit on a substrate, in particular, to the application for the so-called flip-chip bonding of microbumps (protruding terminal electrodes) of an IC chip with corresponding terminals of the microcircuit on the substrate. While there is no special limitation as to the size of the microbump, a size of not greater than 4,000 $\mu$m$^2$ is preferable. For binding such a small microbump, there is no requirement for designing the microbump in high precision.

For establishing electric connection of microbumps on the IC chip and corresponding terminals on the substrate using the anisotropically electroconductive adhesive according to the present invention, the microbumps and the terminals are pressed together under interposition of a layer of the anisotropically electroconductive adhesive in between them favorably at a temperature in the range of 150–250° C., preferably 180–220° C., under a pressure in the range of 50–3,000 kgf/cm$^2$-bump, preferably 100–1,500 kgf/cm$^2$-bump, for a pressing duration in the range of 2–30 seconds, preferably 3–20 seconds.

After the pressing operation under the abovementioned condition, an assured electric connection between the microbumps and the corresponding terminals and a highly reliable electric insulation between adjacent circuit lines and between neighboring microbumps can be maintained, so that they can be brought into fixation as such by causing curing of the insulating resin matrix.

The anisotropically electroconductive adhesive film according to the present invention is formed with the above anisotropically electroconductive adhesive. For the anisotropically electroconductive adhesive film according to the present invention, there is no special limitation as to the film thickness, while it may, in general, favorably be in the range of 5–200 μm, preferably 10–100 μm. For the application for binding microbumps of IC chip(s) with corresponding terminals of micricircuit(s) formed on a substrate, it is favorable to use an anisotropically electroconductive adhesive film having a film thickness which is 1–3 times, preferably 1–2 times the sum of the height of the microbump on the IC chip plus the height of the terminal on the substrate.

If the thickness of the anisotropically electroconductive adhesive film is greater than the above range, number of conductor particles in the film held between the microbump and the terminal within the area capable of contributing to the establishment of the electric connection therebetween will be decreased, since a large amount of the adhesive will be exiled or expelled out of this area upon pressing the microbump together with the terminal. While it may be possible to increase the content of the conductor particles in the adhesive film in order to increase the number of conductor particles held within this arrea, an increase in the production cost should be endured. In addition, the working performance will be decreased thereby due to, for example, staining of the press head by the expelled mass of the adhesive. On the other hand, if the film thickness is lower than the above range, a sufficient distribution of the electrically insulating adhesive matrix over the above-mentioned area during the pressing operation, causing a possible decrease in the bonding strength between the microbumps and the corresponding terminals.

It is preferable that the content of the conductor particles in number in the anisotropically electroconductive adhesive film according to the present invention is the same as that in the anisotropically electroconductive adhesive.

The anisotropically electroconductive adhesive film according to the present invention may be used either as a monolayer film or as a multilayer film, wherein it is permissible that one or more other layers than the adhesive layer according to the present invention may be laminated on either one side or on both sides of an adhesive film according to the present invention. By laminating other layer(s) with the adhesive film according to the present invention, an exilation of the conductor particles out of the binding aera can be prevented. It is also possible to provide the anisotropically electroconductive adhesive film on its outer surface(s) with coverage or protective film(s) for facilitating handling and maintenance thereof.

The anisotropically electroconductive adhesive film according to the present invention can be used also for the same applications as in the previously described anisotropically electroconductive adhesive according to the present invention. Thus, it can be used for binding terminal electrodes on an IC chip with corresponding terminals of microcircuit formed on a substrate.

In the anisopropically electroconductive adhesive and in the anisotropically electroconductive adhesive film according to the present invention, an increase in the content of the conductor particles can be increased without suffering from aggregation of the conductor paricles, since two or more particulate conductor products having different average particle sizes are incorporated. Thus, a high reliability for assured establishment of electric connection of microbumps on an IC chip with corresponding terminals on a substrate can be attained easily at a low cost without causing any short-circuiting between circuit lines and without having any damage on the circuit pattern, even if they are arranged in close intervals, with simultaneous attainment of a high reliability for assured electric insulation between the conductor particles dispersed in the insulating resin matrix.

When conductor particles are deformed upon pressing and if the hardness of the particulate conductor product having greater average particle size is the same with or lower than that of the product having smaller average particle size, the conductor particles of greater average particle size are subjected first to a deformation within the mass of the anisotropically electroconductive adhesive upon press-fixing of the adhesive or the adhesive film, resulting eventually in an establishment of electric connection between the terminal electrodes and the corresponding terminals to be bound, followed by an additional deformation of the conductor particles having smaller particle size which contributes favorably to a more assured electric connection therebetween. Even in such a case, a highly reliable electric insulation between adjacent circuit lines and between neighboring microbumps can be maintained by the electrically insulating resin matrix. Thus, the thickness of layer of the anisotropically electroconductive adhesive according to the present invention upon the press-fixing will not be restricted by the particle size of the particualte conductor product having greater average particle size.

As decribed above, it is possible according to the present invention to attain a highly reliable establishment of electric connection between confronting terminals and a highly reliable electric insulation easily at a lower cost, even for IC chip or circuit pattern designed in close intervals of the microbumps or circuit lines without suffering from any problem of short-circuiting and any damage on the circuit pattern, since two particulate conductor products having different average particle sizes are incorporated.

Since the anisotropically electroconductive adhesive film according to the present invention comprises the adhesive described above, a high reliability for an assured establishment of electric connection and a high reliability for an assured electric insulation can be attained easily at a low cost even in using it for connecting an IC chip having arrangement in close intervals, without causing any short-circuiting between circuit lines and without having any damage on the circuit pattern, with simultaneous attainment of superior performances in handling and in working with it, since it is present as a film.

Below, a concrete mode for embodying the anisotropically electroconductive adhesive film according to the present invention for direct mounting of an IC chip on a circuit pattern-carrying substrate is described with reference to a pertinent Drawing appended.

Figure 5:
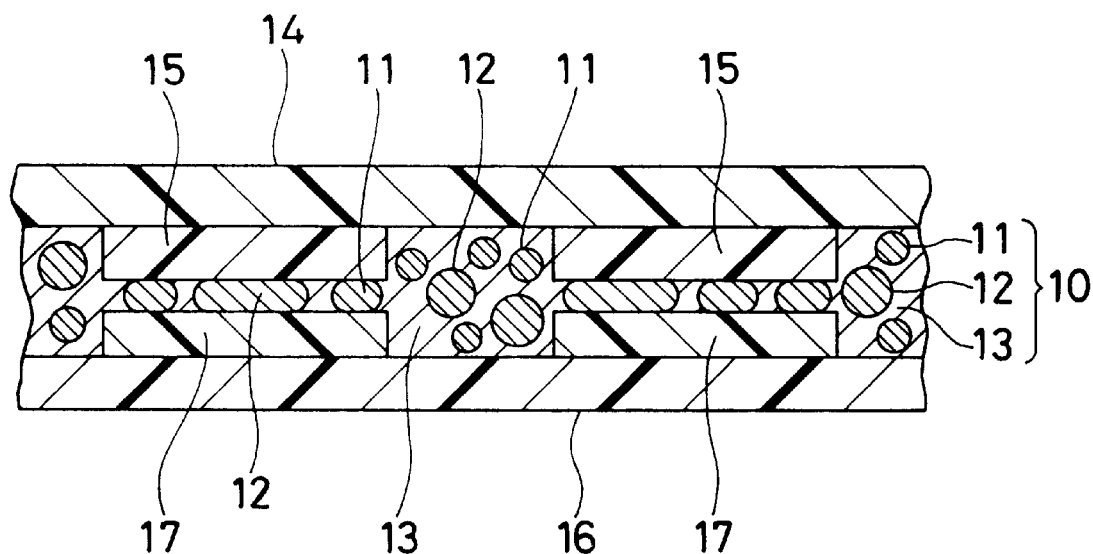
FIG. 5 illustrates the state of establishment of electric connection between the microbumps on an IC chip with corresponding terminals on the circuit pattern on a substrate using the anisotropically electroconductive adhesive according to the present invention in a schematic vertical cross-sectional view.

FIG. 5 illustrates a concrete manner of direct mounting of an IC chip on a circuit pattern-carrying substrate by flip-chip bonding in a schematic vertical sectional view. In the anisotropically electroconductive adhesive film 10, conductor particles 11 having smaller average particle size and conductor particles 12 having greater average particle size are dispersed in the electrically insulating adhesive polymer matrix 13. On the IC chip 14, microbumps 15 are formed. The substrate 16 carries a circuit pattern 17 formed thereon. The conductor particles 11 and 12 are each constituted of a core particle made of a polymer material coated with a metal layer which is further coated with an electrically insulating resin layer, though not shown.

As shown in FIG. 5, an electrical connection is established between the microbumps 15 formed on the IC chip 14 and the circuit line 17 formed on the substrate 16 through the metal coating layer (not shown) on the conductor particles 11 and 12, wherein the IC chip 14 and the circuit pattern-carrying substrate 16 are bonded and fixed with the electrically insulating adhesive polymer matrix 13.

For establishing an electrical connection between the IC chip 14 and the terminals (17) on the substrate 16, the anisotropically electroconductive adhesive film 10 is placed on the substrate 16 and thereon is then placed the IC chip 14 in such a manner that the microbumps 15 and the corresponding terminals 17 to be electrically connected therewith on the substrate 16 will confront to each other, whereupon the IC chip and the substrate are pressed against each other with heating to cause heat press-fixation. During this procedure, the electrically insulating coating layer on the conductor particle 12 having greater average particle size is first softened or molten or even destroyed with simultaneous deformation of the particle 12, whereby the insulating coating layer is expelled out of the region in between the confronting microbump 15 and the terminal 17 and, thus, an electrical connection therebetween is established via the metal coating layer on the conductor particle. Thereafter, the conductor particle 11 having smaller average particle size becomes pressed between the confronting faces of the microbump 15 and the terminal 17, whereby electrical connection therethrough will also be established in the same manner as in the conductor particle 12 having greater average particle size. Thus, a high reliability for the establishment of electrical connection between the microbumps 15 and the corresponding terminals 17 can be attained by means of the anisotropically electroconductive adhesive film 10, since not only the conductor particles 12 having greater average particle size but also the particles 11 having smaller average particle size will partake in the establishment of electrical connection therebetween. Here also, an electric insulation between the conductor particles 11, 12 is assured by the electrically insulating coating layer on the particles and the electrically insulating adhesive polymer matrix 13.

In this manner, by means of the anisotropically electroconductive adhesive film 10, the press-fixing of the IC chip 14 and the circuit pattern-carrying substrate 16,the establishment of electrical connection between the microbumps 15 and the corresponding terminals 17 of the circuit pattern and the assured insulation between adjacent circuit lines 17 can be attained simultaneously and easily at a low cost. In addition, a high reliability not only for the establishment of electrical connection but also for the assured insulation can be attained without suffering from occurrence of short-circuiting and damage on the circuit pattern, even if the microbumps 15 have a small surface area or are arranged in close intervals.

EXAMPLES

In the following, the present invention will be described by way of Examples.

Example 1

An anisotropically electroconductive adhesive was prepared by dispersing two particulate conductor products each having an average particle size of 3 $\mu$m and 5 $\mu$m, respectively, in an electrically insulating adhesive polymer material matrix consisting of an epoxy resin composition (a composition composed of 33.3% by weight of a high molecular weight epoxy resin based on bisphenol A, 33.3% by weight of an epoxy resin based on naphthalene and 33.3% by weight of a latent hardening agent of a dispersed epoxy type based on bisphenol F).

The above particulate conductor product having an average particle size of 3 $\mu$m (hereinafter called B-particles) was obtained by metal-plating a core particle of a benzoguamine resin with Au/Ni and coating thereon with an electrically insulating film of a cross-linked acryl/styrene copolymer resin in a thickness of 0.3 $\mu$m. Here, the insulation coating with the cross-linled acryl/styrene copolymer resin film was effected by treating on a hybridization system. The content of B-particles was settled at 30,000 particles per square millimeter.

The particulate conductor product having an average particle size of 5 $\mu$m (hereinafter called LL-particles) was obtained by metal-plating a core particle of an acryl/styrene copolymer resin with Au/Ni and coating thereon with an electrically insulating film of a cross-linked acryl/styrene copolymer resin in a thickness of 0.3 $\mu$m.

The above anisotropically electroconductive adhesive was processed into a single layer film of a thickness of 75 $\mu$m. The content of the LL-particles in this film was found to be 20,000 particles per square millimeter of the film.

Using this anisotropically electroconductive adhesive film, a test for direct mounting of an IC chip on a circuit pattern-carrying substrate was carried out for assessing the performance for establishing an electrical connection between them and for estimating the performance for the electric insulation in the manner as follows:

(Assessment of Establishment of Electrical Connection)

Each an IC chip for assessment was prepared by forming stud bumps on a rectangular pad of a size of 100 $\mu$m×100 $\mu$m and processing these bumps by flattening so as to obtain a bump face area of either 1,000, 2,000, 3,000, 4,000 or 5,000 $\mu$m$^2$. In each test IC chip, the bump height was about 40 $\mu$m and the chip size was 6 mm×6 mm.

Each a circuit pattern-carrying test substrate was prepared by forming a circuit pattern on a substrate of BT resin of a thickness of 0.7 mm by plating with Cu and, then, with Au in the form of the circuit pattern each in a thickness of 18 $\mu$m. The interval between the terminals in the circuit pattern was 150 $\mu$m.

The anisotropically electroconductive adhesive prepared as above was placed between the test IC chip and the circuit pattern-carrying test substrate prepared as above (the sum of the height of the bump and that of the terminal was about 58 $\mu$m) and the resulting laminate was heat-pressed together at 200° C. under a pressure of 400 kgf/cm$^2$-bump for 20 seconds to establish an electrical connection therebetween. Each of the resulting electrically connected samples was assessed for its reliability of establishment of the electrical connection (reliability in conductance) by the increment in the electric resistance after a 100 hour's saturation pressure cooker test (PCT) at 121° C. under 2.1 atm. performed after the sample had been treated by twice reflowings at 240° C. The results are given in Table 1.

(Evaluation of Insulation Performance)

Evaluation was accomplished using an IC chip having a chip size of 6 mm×6 mm and a bump size of 70 $\mu$m×100 $\mu$m with a bump interval of 10 $\mu$m and a bump height of 20 $\mu$m, a circuit pattern-carrying substrate of a transparent glass plate on which a circuit pattern was formed using ITO (indium tin oxide) with a circuit line interval of 80 $\mu$m, a line width of 70 $\mu$m and a space between the lines of 10 $\mu$m. Occurrence of short-circuiting was detected on a microscope by inspection through the transparent substrate.

The test IC chip and the circuit pattern-carrying test substrate were subjected to establishment of electrical connection therebetween in the same manner as in the electrical connection test. The resulting electrically connected sample was assessed for its electric resistance of insulation by impressing an electric voltage of 25 volts between two adjacent terminal electrodes for 1 minute, after it had been stood for 1,000 hours at a relative humidity of 85% at 85° C. The results are recited in Table 1.

Examples 2–5 and Coparative Examples 1–8

The procedures of Example 1 were repeated with the exception that the particulate conductor products given in Tables 1 and 2 were used and the content thereof was changed as given in Tables 1 and 2. The test results are summarized in Tables 1 and 2.

The symbols given on the line for the "reliability in conductance" in Tables 1 and 2 correspond to the condition:

○ Increment in the resistance is 0.1 Ω or less.

Δ Increment-in the resistance is greater than 0.1 Ω but not higher than 0.3 Ω.

x Increment in the resistance exceeds 0.3 Ω.

The symbols given on the line for the "reliability in insulation" in Tables 1 and 2 correspond to the condition:

○ Increment in the resistance is $10^8$ Ω or greater.

x Increment in the resistance is less than $10^8$ Ω.

Test Example 1

An anisotropically electroconductive adhesive was prepared by dispersing a predetermined amount of B particles in the epoxy resin used in Example 1, wherein the B particles were produced by plating on core particles of benzoguanamine resin having an average particle size of 5 μm with Au/Ni, whereupon the resulting metal-coated particles were subjected to insulation coating with an electrically insulating resin consisting of an acryl/styrene copolymer resin in a coating layer thickness of 0.3 μm.

The above adhesive was formed into a film, whereby a single layer adhesive film having a film thickness of 75 μm was obtained. Using this adhesive film, an IC chip having microbumps with a bump surface area of 1,000–5,000 μm²

TABLE 1

| | | Example | | | | |
|---|---|---|---|---|---|---|
| | | 1 | 2 | 3 | 4 | 5 |
| Particular conductor | 3 μm | B | B | B | LL | B |
| product | 5 μm | LL | LL | B | LL | LL |
| Conductor particle | 3 μm | 30,000 | 40,000 | 30,000 | 30,000 | 30,000 |
| content (particles/mm²) | 5 μm | 20,000 | 30,000 | 20,000 | 20,000 | 20,000 |
| K-value of conductor | 3 μm | 1081 | 1081 | 1081 | 397 | 1081 |
| particles (kgf/mm²) | 5 μm | 397 | 397 | 1081 | 397 | 397 |
| Restorability from | 3 μm | 41 | 41 | 41 | 51 | 41 |
| compression (%) | 5 μm | 48 | 48 | 38 | 48 | 48 |
| Existence of insulating | 3 μm | exist | exist | exist | exist | exist |
| coating | 5 μm | exist | exist | exist | exist | exist |
| Adhesive film Thickness (μm) | | 75 | 75 | 75 | 75 | 75 |
| Layer | | single | single | single | single | doub[1] |
| Bump surface area (μm²) | | 3,000 | 1,000 | 3,000 | 3,000 | 3,000 |
| Reliability in | | | | | | |
| Conductance | | ○ | ○ | ○ | ○ | ○ |
| Insulation | | ○ | ○ | ○ | ○ | ○ |
| Working performance | | better | better | better | better | better |

TABLE 2

| | | Comparative Example | | | | | | | |
|---|---|---|---|---|---|---|---|---|---|
| | | 1 | 2 | 3 | 4 | 5 | 6 | 7 | 8 |
| Particular conductor | 3 μm | B | B | — | LL | B | B | B | B |
| product | 5 μm | — | — | B | B | LL | LL | LL | LL |
| Conductor particle | 3 μm | 40,000 | 40,000 | — | 30,000 | 30,000 | 30,000 | 10,000 | 30,000 |
| content (particles/mm²) | 5 μm | — | — | 40,000 | 20,000 | 20,000 | 20,000 | 20,000 | 10,000 |
| K-value of conductor | 3 μm | 1081 | 1081 | — | 397 | 1081 | 1081 | 1081 | 1081 |
| particles (kgf/mm²) | 5 μm | — | — | 1081 | 1081 | 397 | 397 | 397 | 397 |
| Restorability from | 3 μm | 41 | 41 | — | 51 | 41 | 41 | 41 | 41 |
| compression (%) | 5 μm | — | — | 38 | 38 | 48 | 48 | 48 | 48 |
| Existence of insulating | 3 μm | none | exist | — | exist | exist | exist | exist | exist |
| coating | 5 μm | — | — | exist | exist | exist | exist | exist | exist |
| Adhesive film Thickness (μm) | | 75 | 75 | 75 | 75 | 250 | 50 | 75 | 75 |
| Layer | | doub[1] | doub[1] | single | single | single | single | double | double |
| Bump surface area (μm²) | | 3,000 | 3,000 | 3,000 | 3,000 | 3,000 | 3,000 | 3,000 | 3,000 |
| Reliability in | | | | | | | | | |
| Conductance | | Δ | Δ | ○ | Δ | ○ | Δ | Δ | Δ |
| Insulation | | X | ○ | X | ○ | ○ | ○ | ○ | ○ |
| Working performance | | better | better | better | better | [2] | [3] | better | better |

Notes in Tables 1 and 2:

[1] An anisotropic electroconductive film having a film thickness of 25 μm containing conductor particles is laminated with a film having a film thickness of 50 μm without containing conductor particle. This double layer film was used so as to face the layer containing the conductor particles to the substrate.

[2] A considerable amount of adhesive was extruded aside and the press head was stained.

[3] Adhesion strength was low due to incapability of filling up the space and the IC chip was peeled off.

was directly assembled on a circuit pattern-carrying substrate in the same manner as in Example 1.

After the assemblage, the IC chip was disassembled by heating it at 200° C., whereupon the number of conductor particles present on the bumps and that on the substrate were counted. The total sum of the numbers of particles was assumed to be the number of particles present on the bumps and was counted to determine the average number of conductor particles and the difference between the average numder and the 3σ value (σ is the standard deviation) was determined. The relationship between this difference and the number of conductor particles is recited in FIG. 6 as a graph. Also the relationship between the bump surface area and the number of conductor particles on a bump for adhesive films having a superficial density of the conductor particles of 20,000 particles/mm$^2$ and 30,000 particles/mm$^2$, respectively, is given in FIG. 7 as a graph.

Figure 6:
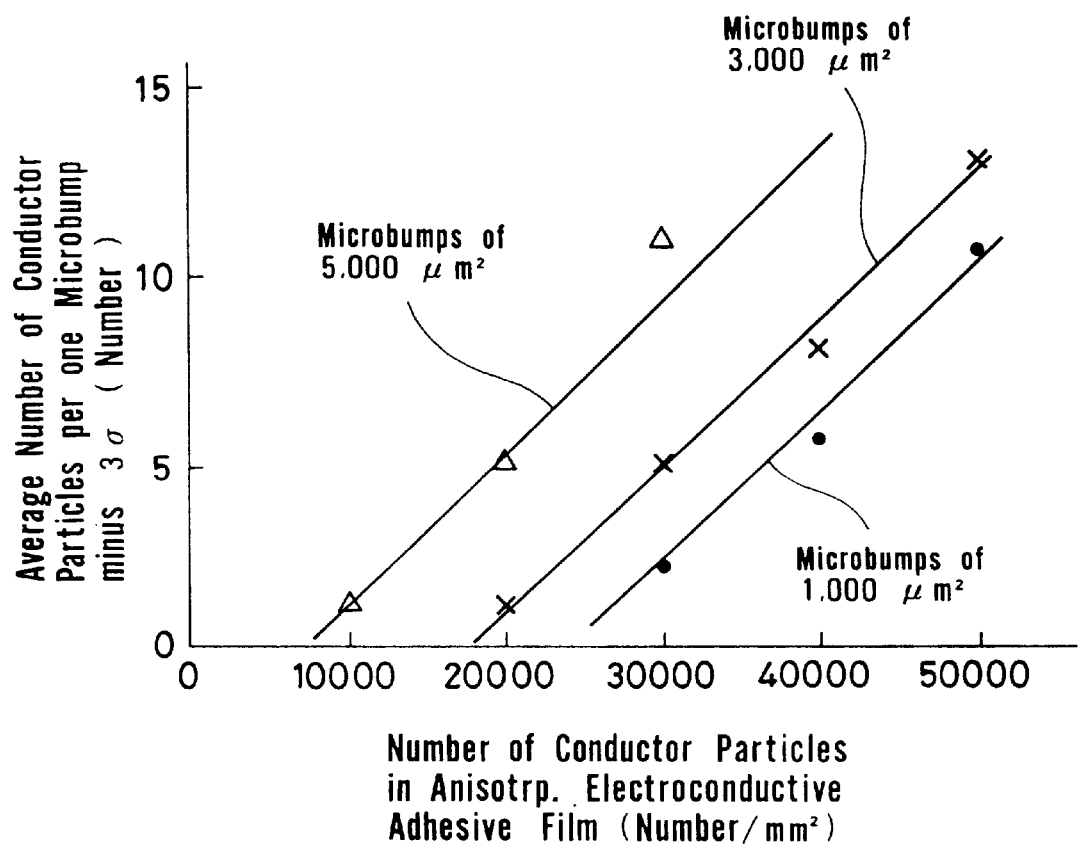
FIG. 6 shows the calculated probability of the number of conductor particles existing on the area of a microbump in relation to the conductor particle content in the anisotropically electroconductive adhesive film.

From FIG. 6, it is seen that at least 30,000 particles per square millimeter are required for reliable presence of 5 particles on a bump for assembling an IC chip having a bump surface area of 3,000 μm$^2$ or less and that at least 40,000 particles per square millimeter are required for 1,000 μm$^2$.

Figure 7:
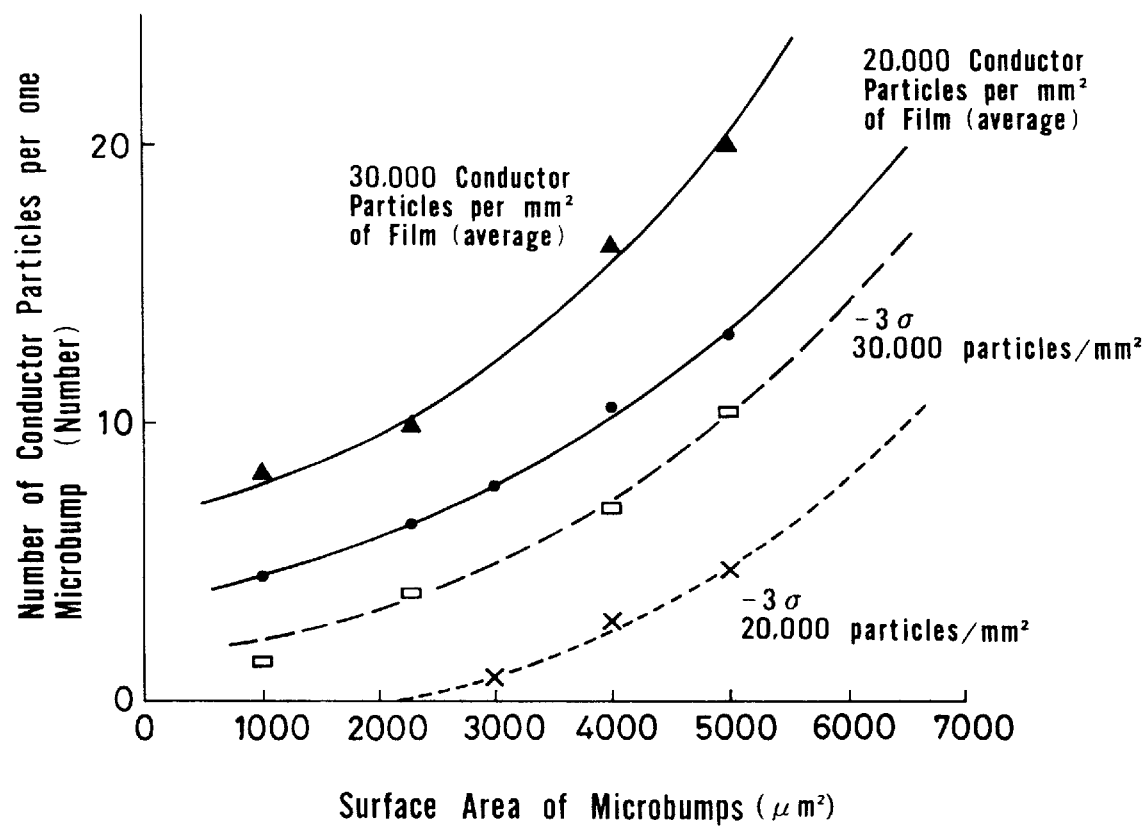
FIG. 7 shows the calculated probability of the number of conductor particles existing on the area of a microbump in relation to the surface area of the microbump and to the conductor particle content in the anisotropically electroconductive adhesive film.

From FIG. 7, it is seen that a bump surface area of 5,000 μm$^2$ or greater is necessary for reliable presence of 5 particles on a bump for an anisotropic electroconductive adhesive film of 20,000 particles/mm$^2$ and a bump surface area of 3,000 μm$^2$ or greater is required for an anisotropically electroconductive adhesive film of 30,000 particles/mm$^2$.

What is claimed is:

1. An anisotropically electroconductive adhesive comprising an electrically insulating adhesive matrix and electroconductive particles dispersed in the matrix, wherein the electroconductive particles comprise at least two electroconductive particulate products of different average particle sizes and wherein each particle of both the particulate products is coated with an electrically insulating resin insoluble in the insulating adhesive matrix.

2. An anisotropically electroconductive adhesive as claimed in claim 1, wherein the particles of said at least two electroconductive particulate products of different average particle sizes are deformable upon application of a pressure.

3. An anisotropically electroconductive adhesive as claimed in claim 1, wherein the hardness of the particles of the electroconductive particulate product having smaller average particle size is at least the same as that of the particles of the electroconductive particulate product having greater average particle size.

4. An anisotropically electroconductive adhesive as claimed in claim 1, wherein the K-value for the particles of the electroconductive particulate product having smaller average particle size is 350 kgf/mm$^2$ or higher and that for the particles of the electroconductive particulate product having greater average particle size is 450 kgf/mm$^2$ or lower and wherein the K-value for the particles of the electroconductive particulate product having smaller average particle size is greater relative to that for the particles of the electroconductive particulate product having greater average particle size.

5. An anisotropically electroconductive adhesive as claimed in claim 1, wherein the total number of particles for the electroconductive particulate product having smaller average particle size in the adhesive is greater than that for the electroconductive particulate product having greater average particle size therein.

6. An anisotropically electroconductive adhesive as claimed in claim 1, wherein the electroconductive particles dispersed therein are composed of two electroconductive particulate products of average particle sizes of 3±0.5 μm and 5±0.5 μm, respectively.

7. An anisotropically electroconductive adhesive as claimed in claim 1, which is to be used for connecting terminal electrodes of an IC chip with corresponding terminals of an electric circuit on a substrate.

8. An anisotropically electroconductive adhesive as claimed in claim 1, which is to be used for connecting microbumps of a size of 4,000 μm$^2$ or smaller formed on an IC chip with corresponding terminals of electric circuit on a substrate.

9. An anisotropically electroconductive adhesive film comprising an anisotropically electroconductive adhesive, the said adhesive comprising an electrically insulating adhesive matrix and electroconductive particles dispersed in the matrix, wherein the electroconductive particles comprise at least two electroconductive particulate products of different average particle sizes and wherein each particle of both the particulate products is coated with an electrically insulating resin insoluble in the insulating adhesive matrix.

10. An anisotropically electroconductive adhesive film as claimed in claim 9, which is to be used for connecting terminal electrodes of an IC chip with corresponding terminals of an electric circuit on a substrate.

11. An anisotropically electroconductive adhesive film as claimed in claim 9, which is to be used for binding microbumps of a size of 4,000 μm$^2$ or smaller formed on an IC chip with corresponding terminals of an electric circuit on a substrate.

12. An anisotropically electroconductive adhesive film as claimed in claim 9, wherein the content of the electroconductive particles in the adhesive film in terms of number of particles thereof per unit surface area of the film is in the range from 30,000 to 80,000 particles/mm$^2$, for the particles of the electroconductive particulate product having smaller average particle size, and is in the range from 10,000 to 30,000 particles/mm$^2$, for the particles of the electroconductive particulate product having greater average particle size, respectively.

13. An anisotropically electroconductive adhesive film as claimed in claim 9, wherein the thickness of the film is 1–3 times the sum of the height of the microbump formed on the IC chip to be bound plus the height of the circuit pattern formed on the substrate.

\* \* \* \* \*

UNITED STATES PATENT AND TRADEMARK OFFICE
CERTIFICATE OF CORRECTION

PATENT NO.    : 5,965,064
DATED         : October 12, 1999
INVENTOR(S)   : Yukio Yamada et al It is certified that error appears in the above-identified patent and that said Letters Patent is hereby corrected as shown below:

<u>Column 18,</u>
Line 53, change "claimed in claim 9" to --- claimed in claim 11 --.

Signed and Sealed this

Twenty-first Day of August, 2001

*Attest:*

*Nicholas P. Godici*

*Attesting Officer*

NICHOLAS P. GODICI
*Acting Director of the United States Patent and Trademark Office*